US005343087A

United States Patent [19]

Furuyama

[11] Patent Number: 5,343,087

[45] Date of Patent: Aug. 30, 1994

[54] SEMICONDUCTOR DEVICE HAVING A SUBSTRATE BIAS GENERATOR

[75] Inventor: Tohru Furuyama, Tokyo, Japan

[73] Assignee: Kabushiki Kaisha Toshiba, Kanagawa, Japan

[21] Appl. No.: 713,014

[22] Filed: Jun. 10, 1991

Related U.S. Application Data

[63] Continuation of Ser. No. 520,057, May 3, 1990, abandoned.

[30] Foreign Application Priority Data

May 24, 1989 [JP] Japan ................................ 1-130710

[51] Int. Cl.[5] ................................ H03K 3/01

[52] U.S. Cl. ................................ 307/296.2; 307/296.6; 307/303

[58] Field of Search ................ 307/296.2, 303.2, 23.6, 307/296.6; 357/42, 23.1, 23.6

[56] References Cited

U.S. PATENT DOCUMENTS 4,564,854 1/1986 Ogura ................................ 357/23.6
4,670,672 6/1987 Ando et al. ........................ 307/296.2
4,798,974 1/1989 Reczek et al. .................... 307/296.2

OTHER PUBLICATIONS

H. Ishiuchi, et al., "Submicron CMOS Technologies for Four Mega Bit Dynamic Ram", May 1985, IEEE, pp. 706-709.

*Primary Examiner*—William L. Sikes
*Assistant Examiner*—Hung Xuan Dang
*Attorney, Agent, or Firm*—Finnegan, Henderson, Farabow, Garrett & Dunner

[57] ABSTRACT

A semiconductor device includes an enhancement MOS transistor formed in a semiconductor substrate and a substrate bias generator supplies a predetermined bias voltage to the substrate. The impurity concentration of the substrate is within the range in which the enhancement MOS transistor keeps the enhancement mode when the substrate potential equals to the built-in potential ΦB.

13 Claims, 3 Drawing Sheets

SEMICONDUCTOR DEVICE HAVING A SUBSTRATE BIAS GENERATOR

This application is a continuation of application Ser. No. 07/520,057 filed May 3, 1990 now abandoned.

BACKGROUND OF THE INVENTION

1. Field of the Invention

This invention concerns a semiconductor device having a substrate bias generator.

2. Description of the Prior Art

Conventionally, a substrate bias generator is widely used. In a dynamic RAM device, the substrate bias generator has important roles, such as the prevention of memory cell errors due to an undershoot of an input signal and the reduction of the capacitance formed by the PN junction in the substrate.

FIG. 1 is a schematic cross sectional view of a conventional semiconductor device which includes an enhancement type dynamic MOS memory cell transistor and a substrate bias generator. Numeral 1 designates a semiconductor substrate of N-type, numeral 2 is a P-type well region, and numeral 3 is an element isolation region. A gate oxide layer 4, a gate electrode 5 made of, e.g., polycrystalline silicon, N-type source region 6 and drain region 7, an N type diffused region 8 and capacitor plate electrode 10 formed on a capacitor insulation layer 9 constitute a dynamic MOS memory cell transistor. BL is a bit line connected to the source region 6.

In the well region 2, another MOS transistor is formed. Namely, a source region 12 and a drain region 13 and a gate electrode 14 formed on a gate oxide layer 15 constitute other MOS transistor. The source region 12 is supplied with the ground potential. The P-type well region 2 is biased by a substrate bias generator 11.

FIG. 2 shows an example of the substrate generator 11. Namely, the bias generator 11 includes a ring oscillator 20, an inverter 27, two capacitors 21, 22, two MOS transistors 23, 24 and two diodes 25 and 26. The common connection of the two MOS transistors 23 and 24 is supplied with the ground potential, and the anodes of the two diodes 25 and 26 are connected to the well region 2 to supply a predetermined bias voltage. Since, the operation of the substrate bias generator 11 is well known, the description thereof is omitted. The bias generator 11 generates a predetermined voltage which is lower than a ground potential, and supplies the potential to the well region 2.

If the integration of a dynamic RAM memory device is increased, and MOS transistors having gate lengths of less than 1 micron are used, the substrate current Isub is significantly increased due to impact ionization. Furthermore, due to high integration, the impurity concentration is increased according to the scaling rule. As an example, the impurity concentration of the well region 2 may be $6\times10^{16}\ cm^{-3}$, according to the scaling rule.

FIG. 3 shows a relationship between an operation current Icc and the power source voltage. Namely, by gradually raising the power source voltage Vcc, the operating current gradually increases. When the power source voltage Vcc reaches a voltage Vin, the current Icc suddenly increases, and goes to point E from point D.

On the other hand, when the power source voltage Vcc drops to Vout, the current Icc suddenly reduces and goes to point G from point F. In other words, the device has a hysteresis characteristic with respect to the power source voltage. The condition between the point E and F is an error operation area of the device, and the large current raises the temperature of the device.

Referring now to FIG. 4, the mechanism of the hysteresis characteristic will be explained. FIG. 4 shows a dependence of the substrate voltage Vsub on the power source voltage Vcc.

When the power source voltage Vcc reaches the Vin, the substrate current Isub equals the pumping capacity Ibb of the substrate bias generator 11, namely the current Ibb pumped by the substrate bias generator 11. If the power source voltage Vcc exceeds the Vin, the substrate current Isub becomes larger than the Ibb (Ibb<Isub). In this condition, the excess current flows to the ground through the N+ source region 12 supplied with the ground potential. Thus, the potential of the well region 2 becomes the built-in potential ΦB, and the PN junction formed between the well region 2 and the N+ region 12 formed in the substrate is forward biased. In this condition, since the substrate voltage is raised, the threshold voltage of the N-channel MOS transistors is lowered due to the back gate bias effect.

FIG. 5 shows a relationship between the impurity concentration of the well region and the threshold voltage of the N-type enhancement MOS transistor. The line I in FIG. 5 illustrates a characteristic of an enhancement MOS transistor which is formed in a well region of $6.0\times10^{16}\ cm^{-3}$ impurity concentration.

As shown by the line I of FIG. 5, the threshold voltage of the enhancement MOS transistor becomes negative when the substrate voltage becomes the built-in potential ΦB. Thus, it is presumed that the change of the enhancement MOS transistor to the depletion mode causes the prescribed rapid increase of the substrate current Isub.

At the same time, the substrate current is also increased due to impact ionization occurring at an increasing tempo. Thus, even if the power source voltage is lowered, the operation current Icc does not decrease to the point positioned on the original characteristic curve, but to the point F, as previously explained referring FIG. 3.

The phenomenon that the substrate current Isub exceeds the pumping capacity Ibb of the substrate generator sometimes occurs at the initial precharge of the bit lines and the capacitor plate electrodes of the memory cell transistors after the power source supply.

Since the pumping capacity of the substrate bias generator is in proportion to the capacitance of the capacitors 21 and 22, the capacitance off the capacitors may be increased to prevent the erroneous operation due to the substrate current. However, a large capacitance requires a large area for the capacitor, and this is unfavorable for the integration of the device.

SUMMARY OF THE INVENTION

Accordingly, an object of the present invention is to provide a semiconductor device in which the hysteresis characteristic can be restrained without increasing the capacitance of the substrate bias generator.

Another object of the present invention is to provide a semiconductor device in which the change of the enhancement MOS transistor to the depletion MOS transistor can be prevented, even if the substrate potential becomes a built-in potential.

To achieve the object, this invention provides a semiconductor device including a semiconductor region supplied with a predetermined voltage and having a predetermined impurity concentration of a first conductivity type, comprising: an enhancement type MOS transistor formed in the semiconductor region, and having a gate electrode, a source and a drain regions of a second conductivity type, the source region being supplied with a reference voltage; and a substrate bias generating circuit for supplying the predetermined voltage to the semiconductor region; wherein the predetermined impurity concentration of the semiconductor region is within a range such that the enhancement type MOS transistor remains an enhancement type if the difference between the semiconductor region predetermined voltage and the source region reference voltage equals to the built-in potential.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Referring now to drawing, an embodiment of the present invention will be explained.

In accordance with the present invention, the well region of the substrate supplied with a predetermined bias voltage by a substrate bias generator has an impurity concentration sufficient to keep the MOS transistor in the well region in the enhancement mode, even if the voltage on the well region equals to the built-in potential ΦB.

Namely, the inventor discovered that when the impurity concentration of the well region off substrate is less than $3\times10^{16}$ $cm^{-3}$, the threshold voltage of the enhancement MOS transistor retains a positive value, even if the substrate potential equals to the built-in potential.

Figure 1:
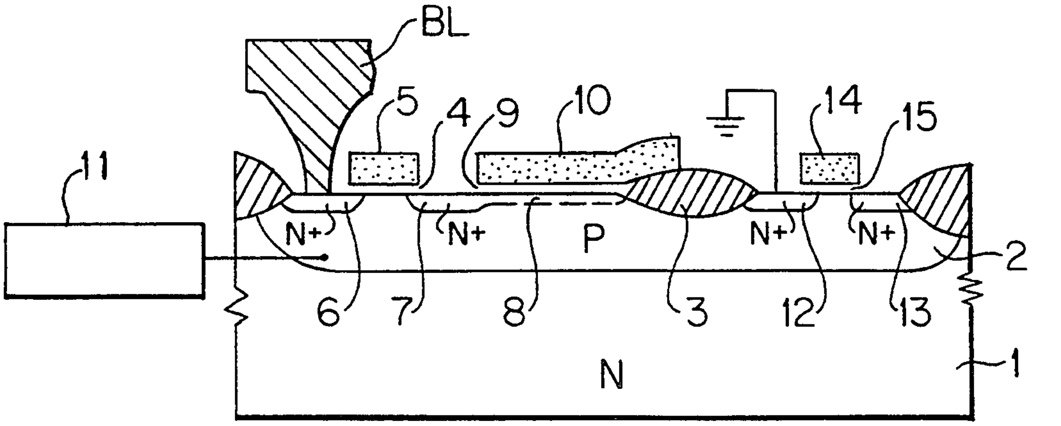
FIG. 1 PRIOR ART
FIG. 1 is a schematic cross sectional view of a semiconductor device which includes an enhancement type MOS memory cell transistor and a substrate bias generator.
Figure 2:
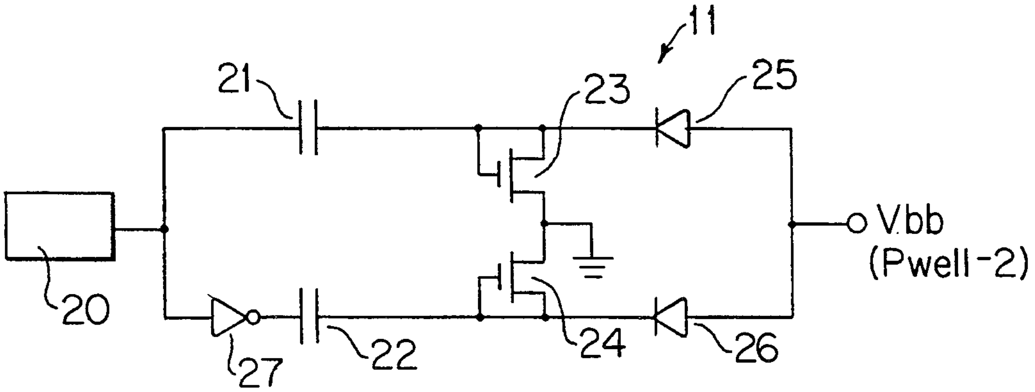
FIG. 2 PRIOR ART
FIG. 2 is a circuit diagram of an example of the substrate bias generator.
Figure 7:
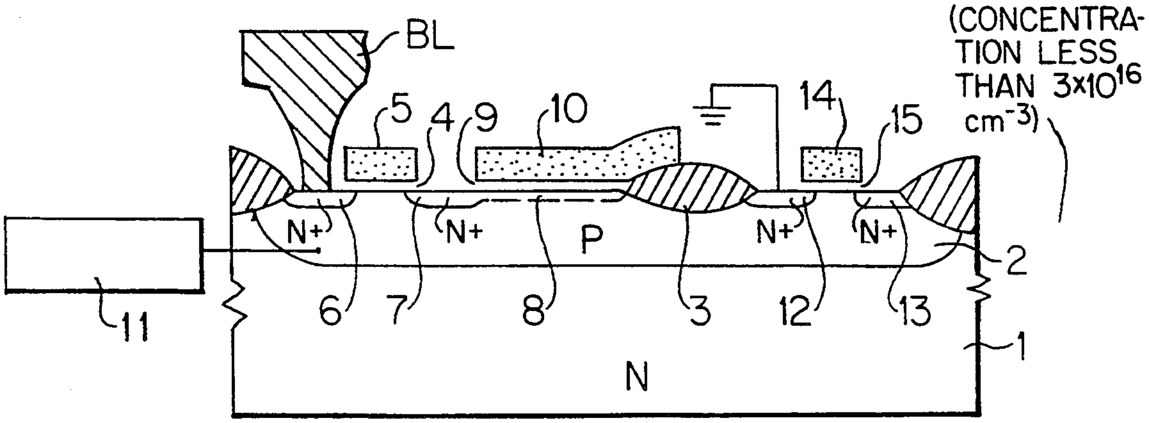
FIG. 7 is a schematic cross sectional view of a semiconductor device which includes an enhancement type MOS memory cell transistor and a substrate bias generator according to the present invention.
Figure 3:
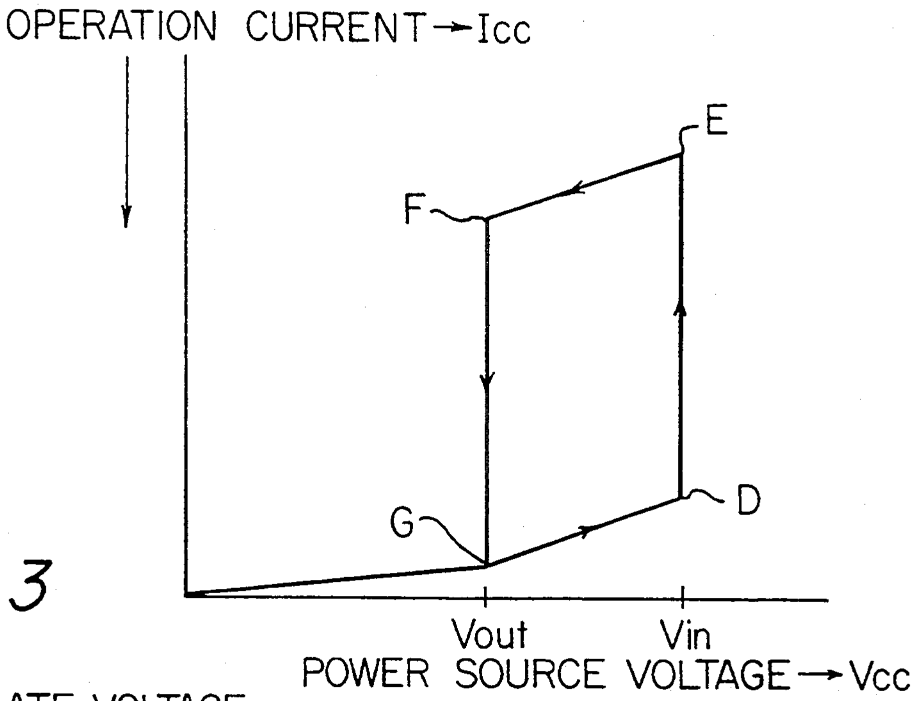
FIG. 3 shows a hysteresis characteristic of the semiconductor device.
Figure 4:
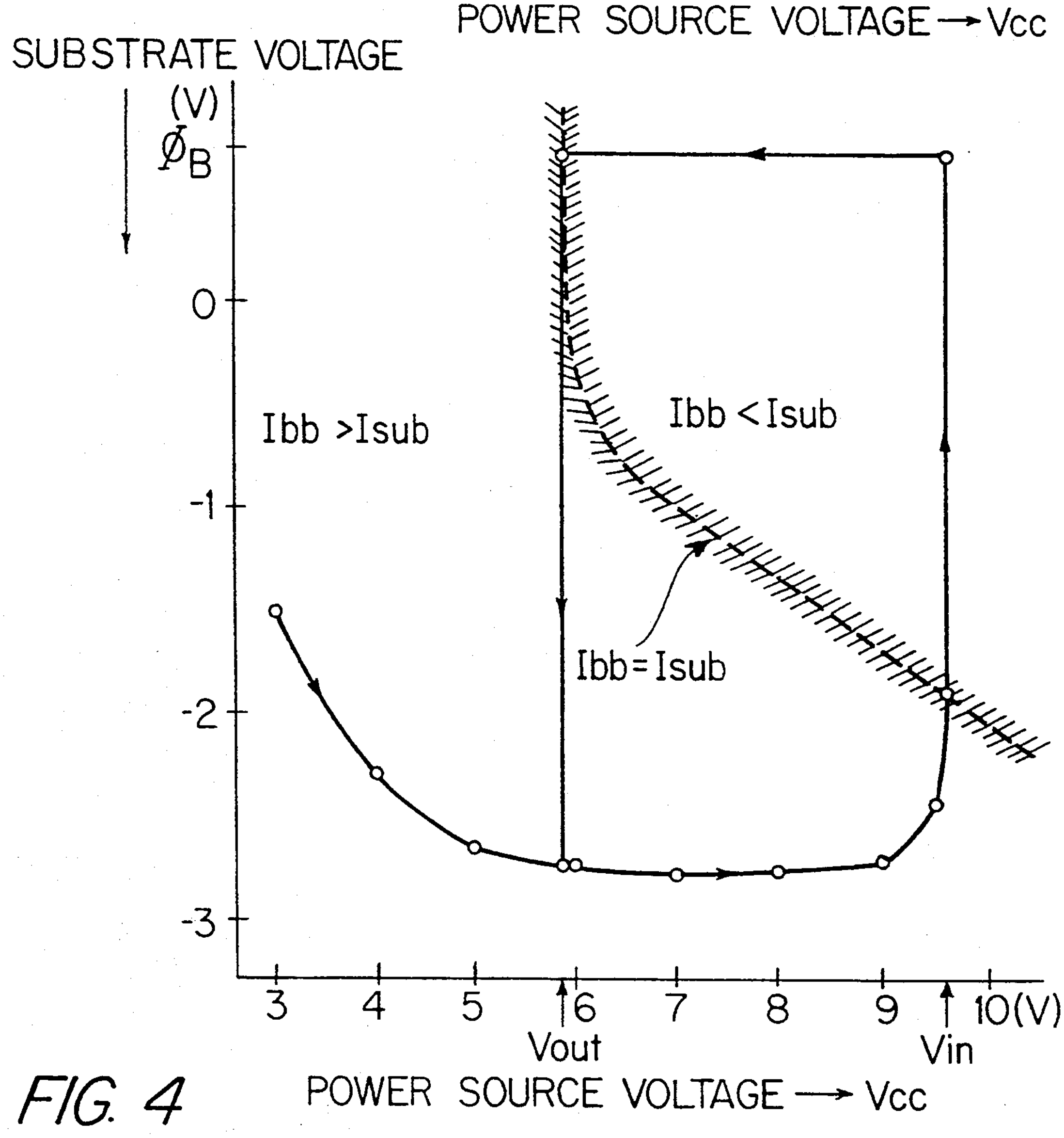
FIG. 4 shows a relationship between the power source voltage and the substrate potential.
Figure 5:
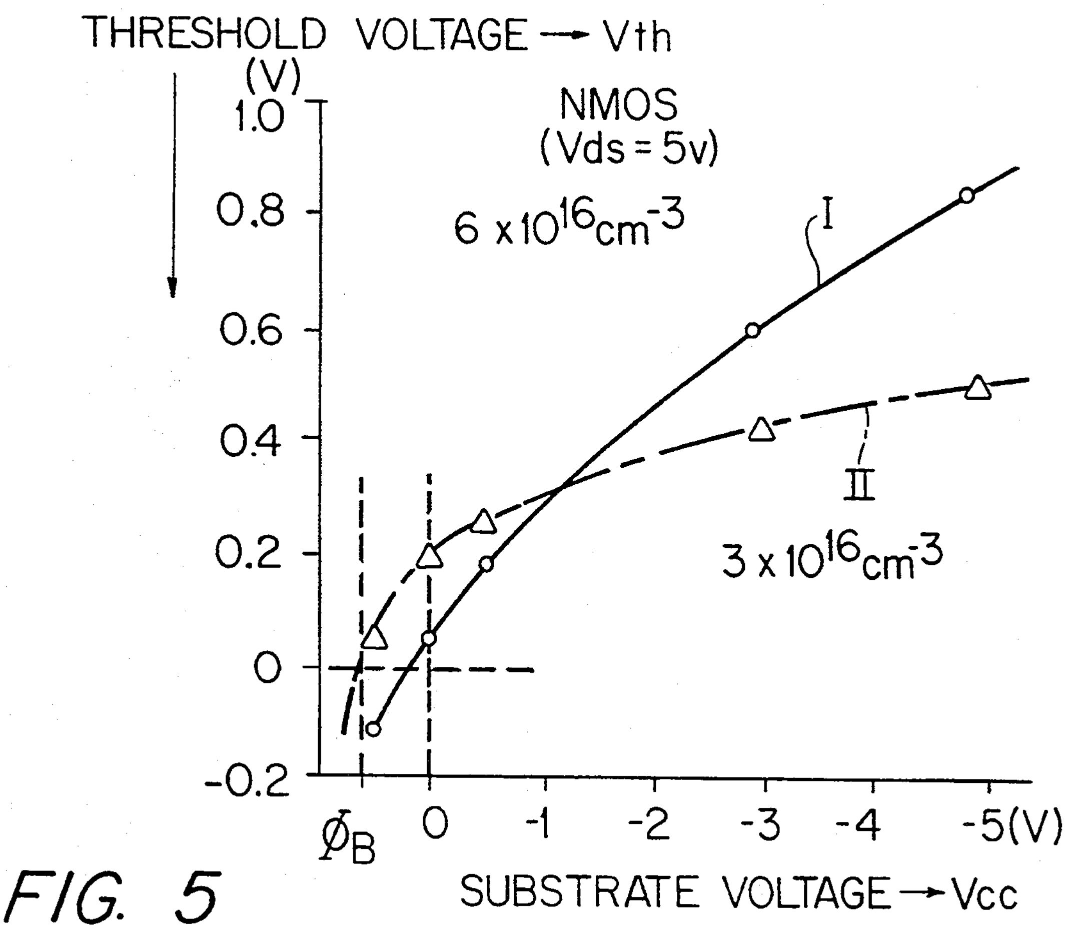
FIG. 5 shows a relationship between the substrate voltage and the threshold voltage of the enhancement MOS transistor.

The line H in FIG. 5 illustrates a characteristic of an N-type enhancement MOS transistor which is formed in a well region of $3\times10^{16}$ $cm^{-3}$ impurity concentration. As illustrated by the line II, the threshold voltage keeps a positive value when the voltage on the well region 2 equals to the built-in potential ΦB. This means that the enhancement mode is maintained, even if the voltage on the well region 2 equals to the built-in potential ΦB. This phenomenon influences the hysteresis characteristic of the semiconductor device.

Figure 6:
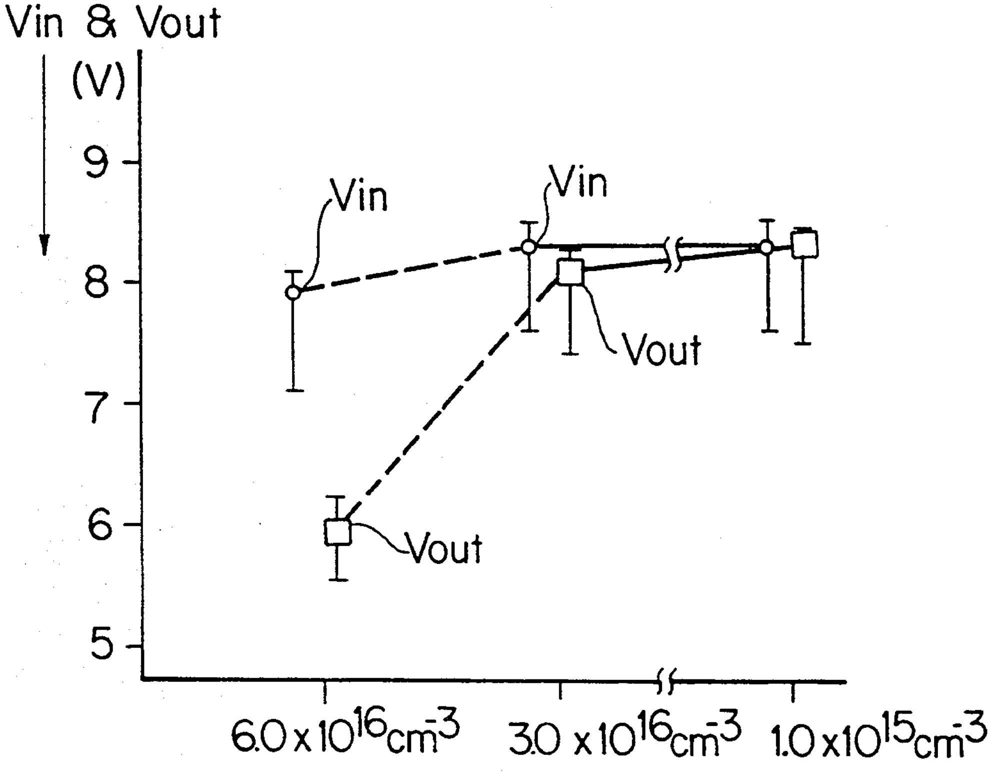
FIG. 6 shows a dependence of the Vin (or Vout) when the substrate voltage becomes the built-in potential ΦB on the impurity concentration of the substrate or well region.

FIG. 6 shows a relationship between the impurity concentration of the well region 2 and the distance between the voltages Vin and Vout. As shown in FIG. 6, when the concentration is higher than about $3\times10^{16}cm^{-3}$ the difference between the Vin and Vout becomes large. This means that the hysteresis characteristic becomes significant when the concentration is larger than about $3\times10^{16}cm^{-3}$.

In other words, the hysteresis characteristic can be restrained in the case where the concentration is less than $3\times10^{16}cm^{-3}$. This is because the enhancement MOS transistor keeps the enhancement mode even if the well potential equals to the built-in potential ΦB and the substrate current is restricted. As a result, the operation current Icc returns or is reduced immediately to the point located on the original characteristic curve.

It has been reported that the leakage current between the adjacent trenches formed in the substrate increases when the concentration of the substrate becomes low (see: IEDM 85, P706 to 709). Thus, it is preferable to keep the concentration of the substrate more than about $1\times10^{15}$ $cm^{-3}$, since the distance between the adjacent trenchs is approximately less than 2 microns in a device formed according to 1 micron design rule. When the impurity concentration is $1.0\times10^{15}$ $cm^{-3}$, the difference between the Vin and the Vout is made narrow, and the hysteresis characteristic is restrained, as shown in FIG. 6.

In the aforementioned embodiment, N-type MOS transistors are formed in a P-well. However, this invention can be applied to a semiconductor device in which P-channel MOS transistors having source regions supplied with a power source voltage are formed in an N-well region or in an N-type substrate. In this case, a substrate bias generator supplies a predetermined voltage which is higher than the power source voltage to the well region or to the substrate.

In this construction, the difference in voltage between the well region and the source region supplied with a power source voltage as the reference voltage becomes the built-in potential ΦB, when the substrate current Isub exceeds the pumping capacity Ibb of the substrate bias generator. However, the hysteresis characteristic of the semiconductor device can be restrained by the same method as previously explained, according to the present invention.

Furthermore, this invention can be applied to so called SOI device. Since the back gate bias effect is restrained in the SOI device, the back gate bias effect is effectively reduced by the additive effects of the SOI construction and the present invention.

The present invention has been described with respect to a specific embodiment. However, other embodiments based on the principles of the present invention should be obvious to those of ordinary skill in the art. Such embodiments are intended to be covered by the claims.

What is claimed is:

1. A semiconductor device including a reference voltage, comprising:

a substrate region of a first conductivity type;

a bias generating circuit, coupled to the substrate region, including means for biasing the substrate region toward a predetermined voltage; and a MOS transistor, juxtaposed to the substrate region, including a source region of a second conductivity type coupled to the reference voltage, the source region defining a P-N junction with the substrate region, a gate electrode, and a drain region of the second conductivity type, the substrate region having an impurity concentration within a range causing the MOS transistor to be of the enhancement type at times when the difference between a voltage in the substrate region and the reference voltage is substantially equal to a built-in potential of the P-N junction.

2. The semiconductor device according to claim 1, wherein a distance between the source and drain regions of the MOS transistor is less than one micron.

3. The semiconductor device according to claim 1, wherein the impurity concentration of the substrate region is between $1\times10^{15}cm^{-3}$ and $3\times10^{16}$ $cm^{-3}$.

4. The semiconductor device according the claim 3, wherein the substrate region is a P-type well region in a semiconductor substrate and the MOS transistor is an N-channel MOS transistor, and the predetermined voltage is lower than the reference voltage.

5. The semiconductor device according to claim 3, wherein the substrate region is an N-type, and the MOS transistor is a P-channel type, and the predetermined voltage is higher than the reference voltage.

6. The semiconductor device according to claim 1, further including an enhancement type MOS memory cell transistor, juxtaposed to the substrate region, including a memory cell transistor source region, and a memory cell transistor drain region, wherein the distance between memory cell transistor source and drain regions is less than one micron.

7. The semiconductor device according to claim 1, wherein a distance between the source and drain regions of the MOS transistor is less than one micron, and the impurity concentration of the substrate region is between $1\times10^{15}cm^{-3}$ and $3\times10^{16}cm^{-3}$.

8. The semiconductor device according to claim 1, further including an enhancement type MOS memory cell transistor, juxtaposed to the substrate region, including a memory cell transistor source region, and a memory cell transistor drain region, wherein the distance between the memory cell transistor source and drain regions is less than one micron, and the impurity concentration of the substrate region is between $1\times10^{15}cm^{-3}$ and $3\times10^{16}cm^{-3}$.

9. The semiconductor device according to claim 1, wherein a distance between the source and drain regions of the MOS transistor is less than one micron, and the semiconductor device further includes a second MOS transistor, juxtaposed to the substrate region, of the enhancement type and constituting a memory cell including a second source region, and a second drain region, wherein the distance between the second source region and second drain region is less than one micron, and the impurity concentration of the substrate region is between $1\times10^{15}cm^{-3}$ and $3\times10^{16}cm^{-3}$.

10. A semiconductor device including a reference voltage and a power voltage, comprising:

a substrate region of a first conductivity type;

a bias generating circuit, coupled to the substrate region, having a limited current capacity for biasing the substrate region toward a predetermined voltage by supplying a current to the substrate region; and a MOS transistor, juxtaposed to the substrate region, including a source region of a second conductivity type coupled to the reference voltage, the source region defining a P-N junction with the substrate region, a gate electrode, and a drain region of the second conductivity type, the bias generating circuit operating at the limited current capacity and the difference between a voltage in the substrate region and the reference voltage being substantially equal to a built-in potential of the P-N junction at a time when the power source voltage exceeds a certain value, and the substrate region having an impurity concentration having an upper limit causing the MOS transistor to have a positive threshold at times when the difference between the voltage in the substrate region and the reference voltage is substantially equal to the built-in potential.

11. The semiconductor device according to claim 10, wherein a distance between the source and drain regions of the MOS transistor is less than one micron, and the impurity concentration of the substrate region is between $1\times10^{15}cm^{-3}$ and $3\times10^{16}cm^{-3}$.

12. The semiconductor device according to claim 10, further including a second MOS transistor of the enhancement type and constituting a memory cell, juxtaposed to the substrate region, including a second source region, and a second drain region, wherein the distance between the second source region and second drain region of the second MOS transistor is less than one micron, and the impurity concentration of the substrate region is between $1\times10^{15}cm^{-3}$ and $3\times10^{16}cm^{-3}$.

13. The semiconductor device according to claim 10, wherein a distance between the source and drain regions of the MOS transistor is less than one micron, and the semiconductor device further includes an enhancement type MOS memory cell transistor, juxtaposed to the substrate region, including a memory cell transistor source region, and a memory cell transistor drain region, wherein the distance between memory cell transistor source and drain regions is less than one micron, and the impurity concentration of the substrate region is between $1\times10^{15}cm^{-3}$ and $3\times10^{16}cm^{-3}$.

* * * * *